United States Patent
Bedgedjian (10) Patent No.: US 6,993,089 B2
(45) Date of Patent: Jan. 31, 2006

(54) DIGITAL MODULATOR

(75) Inventor: Jean-Christophe Bedgedjian, Champs sur Marne (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 747 days.

(21) Appl. No.: 10/095,509

(22) Filed: Mar. 12, 2002

(65) Prior Publication Data

US 2002/0181570 A1 Dec. 5, 2002

(30) Foreign Application Priority Data

Mar. 13, 2001 (FR) .................................. 01 03413

(51) Int. Cl.
*H04L 27/00* (2006.01)
(52) U.S. Cl. ..................................... 375/295; 375/229
(58) Field of Classification Search ................ 375/219, 375/238, 239, 242, 302, 303, 306, 308, 229, 375/295; 708/313, 300, 200, 290
See application file for complete search history.

(56) References Cited

U.S. PATENT DOCUMENTS

| 4,790,015 | A | * | 12/1988 | Callens et al. ............... 704/212 |
| 5,764,113 | A | * | 6/1998 | Snell ........................... 332/103 |
| 6,128,357 | A | * | 10/2000 | Lu et al. ...................... 375/355 |
| 6,140,822 | A | * | 10/2000 | Williams ..................... 324/620 |
| 6,169,767 | B1 | * | 1/2001 | Strolle et al. ................ 375/302 |
| 6,421,396 | B1 | * | 7/2002 | Hawley et al. .............. 375/308 |
| 6,545,532 | B1 | * | 4/2003 | Maalej et al. ............... 329/304 |
| 6,563,862 | B1 | * | 5/2003 | Knutson et al. ............. 375/219 |

FOREIGN PATENT DOCUMENTS

FR 2753590 3/1998

* cited by examiner

*Primary Examiner*—Tesfaldet Bocure
*Assistant Examiner*—Vineeta Panwalkar
(74) *Attorney, Agent, or Firm*—Adam L. Stroud (57) ABSTRACT

The present invention relates to a digital modulator (DM) and to an associated method of modulation. The digital modulator (DM) comprises a clock frequency (Fclk) and is able to process a digital signal (S(TA)) comprising symbols (SYMB) sampled at a symbol frequency (Fsy). It is characterized by interpolation means (INT) able to interpolate a new sample (OUT) on the basis of interpolation parameters (δ, SIGN) and of signals (LS, TS, F0, F2) derived from the digital signal (S(TA)), interpolation parameters (δSIGN) being calculated as a function of a variable and real ratio (R) proportional to the symbol frequency (Fsy) over the clock frequency (Fclk).

7 Claims, 6 Drawing Sheets

DIGITAL MODULATOR

The present invention relates to a digital modulator comprising a clock frequency and being able to process a digital signal comprising symbols sampled at a symbol frequency. It also relates to a method of processing the signal adapted to said modulator. It finds a particular application especially during transmissions of digital signals via wire media such as cable, aerial media such as the airwaves or else optical media such as optical fibers.

Patent FR2753590 filed on Sep. 19, 1996, corresponding to patent U.S. Pat. No. 6,134,225 filed on Sep. 17, 1997, describes a system for digital transmissions by satellites. The system comprises a digital modulator. The modulator comprises an oscillator which generates a fixed clock frequency. Within the framework of transmissions of a digital signal, said signal is processed in the form of symbols to be transmitted. A symbol frequency is associated with the transmission of these symbols. Within the framework of transmission via a cable, for example, this symbol frequency comprises values which are fixed within standards such as DAVIC (Digital Audio-Visual Council),-DVB (Digital Video Broadcasting) published by the ETSI (European Telecommunications Standard Institute) referenced ETS300800 or else DOCSIS (Data Over Cable Service Interface Specifications) published by the RFI (Radio Frequency Interface) referenced SP-RFI-104-98724. Said values are respectively 256 kbits/s or multiples of 1,544 Mbits/s or else 160 ksymb/s. In accordance with the symbol frequencies which may be used, the clock frequency of the modulator is associated appropriately. Thus, depending on the standard implemented, the clock frequency is chosen in such a way that it corresponds to the lowest common multiple of the usable symbol frequencies. In current systems, the ratio of the clock frequency to the symbol frequency must be an integer and sometimes even a power of 2.

Although this state of the art makes it possible to manage several symbol frequencies, the complexity of this management increases with the symbol frequencies used. Moreover, this system is rather inflexible since it does not allow continuous use of the range of symbol frequencies.

Hence a technical problem to be solved by the object of the present invention is that of proposing a digital modulator comprising a clock frequency and being able to process a digital signal comprising symbols sampled at a symbol frequency, as well as an associated digital signal processing method, which would make it possible to simplify the management of symbol frequencies and to extend the range of the symbol frequencies which are usable by said modulator.

One solution to the technical problem posed is characterized, according to a first object of the present invention, in that the digital modulator comprises:

interpolation means able to interpolate a new sample on the basis of interpolation parameters and of signals derived from the digital signal, interpolation parameters being calculated as a function of a variable and real ratio proportional to the symbol frequency over the clock frequency.

According to a second object of the present invention, the solution is characterized in that the digital signal processing method comprises the steps of:

calculating interpolation parameters, calculating a new sample on the basis of interpolation parameters and of signals derived from the digital signal, interpolation parameters being calculated as a function of a variable and real ratio proportional to the symbol frequency over the clock frequency.

Thus, as will be seen in greater detail later, the interpolation means make it possible to process the digital signal in such a way that the clock frequency no longer depends on the symbol frequency or frequencies which one desires to use. The choice of the ratio is free of any constraint. Therefore the management of the symbol frequencies is more flexible and simplified.

The description which follows, in conjunction with the appended drawings, the whole given by way of a non-limiting example, will clearly elucidate the essence of the invention.

Figure 1:
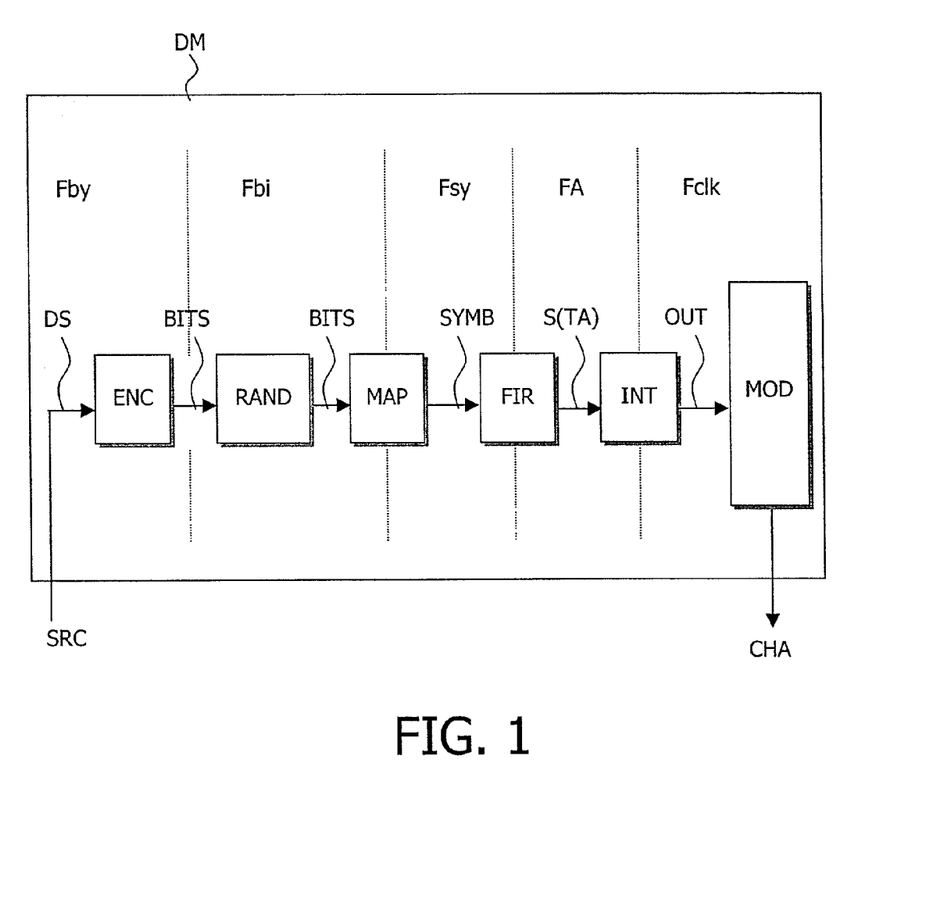
FIG. 1 diagrammatically illustrates a digital modulator architecture according to the invention.

The present description of the invention deals with an exemplary digital modulator DM used in the field of cable-based inter-activity. In this field, digital signals are exchanged via a physical channel for hybrid transmissions, such as a coaxial cable and optical fiber. The digital modulator DM allows the transmission of these signals via such a channel. Represented in FIG. 1 is a diagram of an architecture of said modulator DM. Said modulator comprises a clock frequency Fclk, error detection means ENC, scrambling means RAND, labeling means MAP, first filtering means FIR, interpolation means INT and means of modulation MOD on a carrier frequency Fca.

The digital modulator DM receives as input a digital signal DS from one or more sources such as memories of a cable modem. Said signal DS is composed of bytes and is transmitted according to a first frequency Fby in bytes/s. In order to transmit said digital signal DS over a channel, the modulator transmits a sinusoidal signal. To this end, the digital signal DS is modulated on a carrier frequency Fca. The carrier frequency is determined by the standard used. Thus, for the DVB standard the carrier frequency can take a value between 5 MHz and 65 MHz, while for the DOCSIS standard it takes a value between 5 MHz and 42 MHz. However, before performing a modulation, several prior steps are necessary. We take as an example a phase quadrature QPSK modulation (Quadrature Phase Shift Keying). The steps are described below.

During transmission of a signal DS via a channel CHA, the latter may introduce disturbances which give rise to errors during the reception of DS. Also, the error detection means ENC make it possible to transform said signal DS in such a way that the errors are detected and corrected subsequently. These means ENC are based on a redundancy and likelihood principle called "Reed-Solomon", known to the person skilled in the art. At the output of said detection means ENC, the digital signal is serialized in binary form according to a binary frequency Fbi in bits/s (one byte being equal to 8 bits).

The source SRC transmits a priori arbitrary bit sequences. It is necessary to avoid the transmission of a constant sequence, which would have the effect of transmitting a pure frequency of high power on the channel CHA, which would run the risk of damaging the channel. In order to avoid such a risk, the scrambling means RAND scramble the digital signal with a pseudo-random sequence so as to render it pseudo-random, that is to say random in the short term.

However, the binary digital signal is not transmitted directly on the channel CHA. It is transmitted in the form of symbols SYMB. At input the labeling means MAP recover the bits of the binary digital signal and code them in the form of symbols SYMB.

Figure 2:
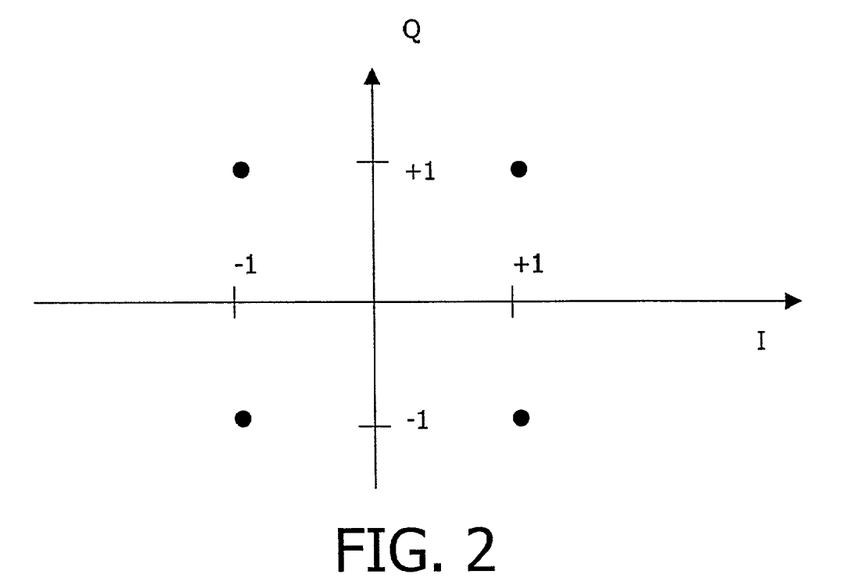
FIG. 2 is a diagram of symbols managed by the modulator of FIG. 1.

Stated otherwise, each symbol SYMB codes two bits I and Q; this corresponds, for example, to the following code.

| I | Q | SYMB |
|---|---|------|
| 0 | 0 | -1 -1 |
| 0 | 1 | -1 1 |
| 1 | 1 | 1 1 |
| 1 | 0 | 1 -1 |

The transmission of the signal is then represented by a symbol frequency Fsy. In this example, the binary frequency Fbi is equal to twice the symbol frequency Fsy. Thus, a potential quantity of bits which would be transmitted in the case where the digital modulator did not comprise any labeling means is doubled.

The transmission channel CHA possesses a bandwidth which is shared by various users. Consequently, the signal transmitted by each user is one with limited band. To do this, use is made, preferably, of first matched filtering means FIR. Moreover, with this filter one seeks to minimize inter-symbol interference (ISI) which gives rise to a deformation of the signal transmitted. To this end, the first filtering means FIR used are, for example, a root Nyquist raised cosign filter with rolloff factor α as is well known to the person skilled in the art. In this case, at the output of the filter, we have a digital signal S(TA) sampled at a first frequency of the samples FA=2Fsy.

Subsequently, the interpolation means INT make it possible to over-sample the digital signal S(TA) at a second frequency of the samples Fclk>2Fmax, Fmax being the maximum frequency of the signal transmitted on the carrier frequency Fca, so as to comply with the criterion stated by Shannon's theorem, and Fclk being the clock frequency of the digital modulator DM. It will be noted that Fmax=Fca+Fsy(1+α). α is the rolloff factor and is equal to 30% in the DVB standard and 25% in the MCNS standard.

In accordance with a non-limitative embodiment, the interpolation means INT are described in the patent U.S. Pat. No. 5,349,548 granted in the name of the company PHILIPS ELECTRONICS N.V. and filed on May 13, 1993. The entire content of this patent is to be regarded as forming an integral part of the present application. These interpolation means INT make it possible to undertake an interpolation on the basis of a sampled input digital signal S(TA) by artificially delaying, by a delay ΔT, said signal so as to calculate new samples OUT. The maximum delay ΔT required is estimated to be plus or minus TA/2, TA being the period of the samples at input. All the new samples OUT that can be calculated on the basis of the input samples S(TA) are covered in this way. For example, if there are three input samples S(1), S(2) and S(3), the new samples between [S(0.5), S(1,5)], [S(1,5), S(2,5)] and [S(2,5), S(3.5)] will be calculated. In order to calculate new samples OUT, a correction term must be added to the input samples S(TA). The correction term is a function (δ)=|δ|*(|δ|*F1+(1-|δ|)*SIGN*F2)(1). As we shall see in detail later, said function G(δ) corresponds to a transfer function $H(Z)=Z^{-\partial/2}$ expressing said delay ΔT. We have ΔT=∂*TA/2 with ∂=-1, ..., 1 ... ∂ expressing a lag normalized with respect to TA/2.

We shall see below how this function is calculated and whereto its component terms correspond.

Figure 3:
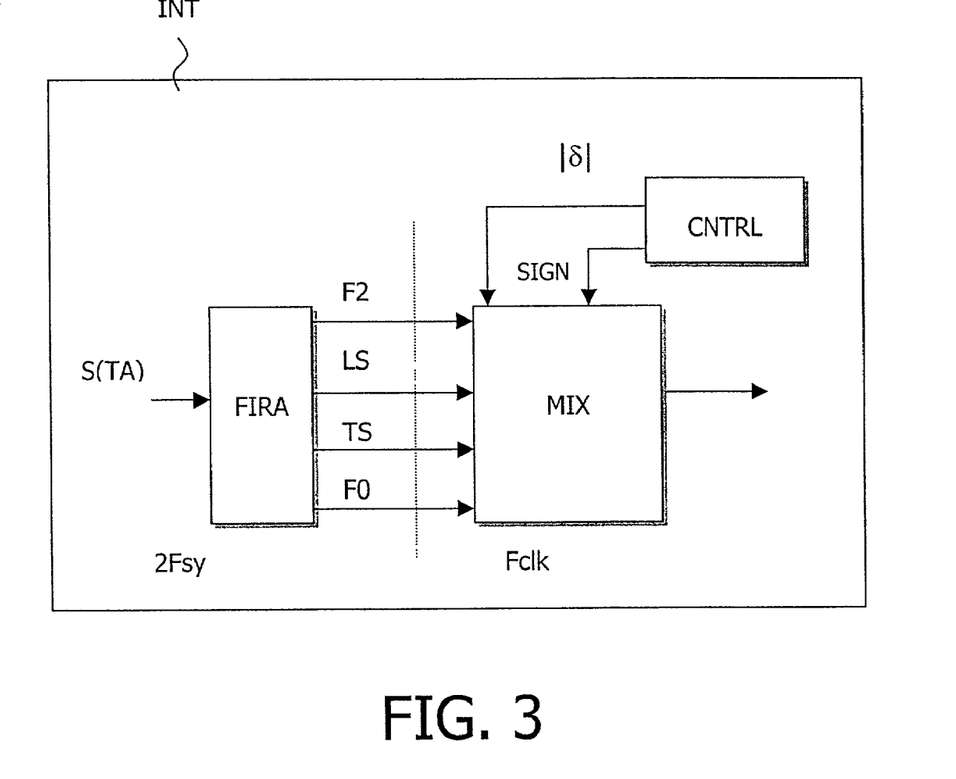
FIG. 3 is a diagram of interpolation means included in the modulator of FIG. 1, FIG. 4 diagrammatically illustrates a first part of the interpolation means of FIG. 3.

As FIG. 3 shows, the interpolation means INT preferably comprise:
second filtering means FIRA;
control means CNTRL,
means for calculating samples MIXER.

Figure 4:
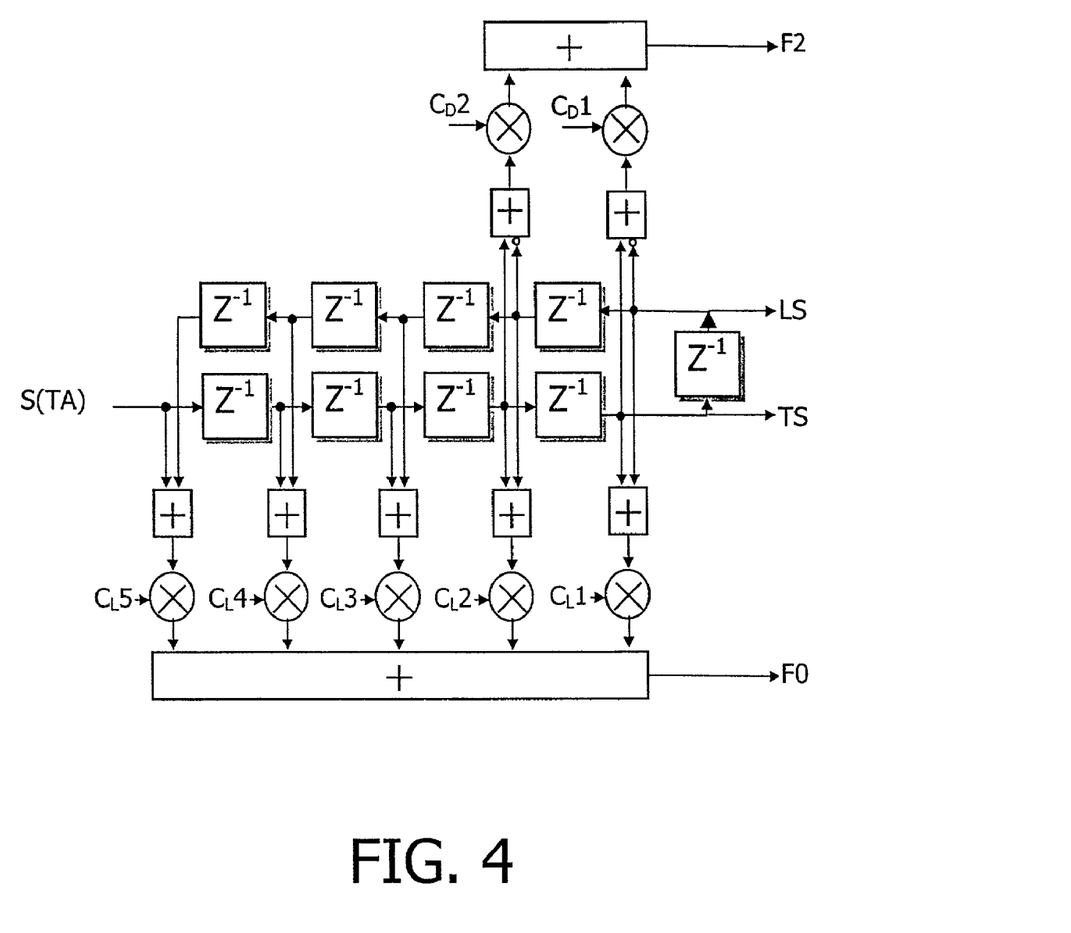

The second filtering means FIRA make it possible to filter the input digital signal S(TA) so as to obtain derived signals comprising base signals and filtered signals. Thus, on the basis of samples of the digital input signal S(TA), we obtain two unfiltered base samples LS and TS, a first filtered reference signal F0, and a second filtered signal F2. According to a non-limitative embodiment, the structure of the second filtering means FIRA is presented in FIG. 4. Said means comprise a delay line and multiplier coefficients $C_L$, $C_D$. The delay line consists of delays $Z^{-1}$ each delaying the input samples S(TA) by a sample period TA. The base signals LS, TS are obtained in this way. The filtered signals F0 and F2 are obtained by performing a supplementary step which is that of multiplying the delayed input samples S(TA) by five multiplier coefficients $C_L1$ to $C_L5$ and two multiplier coefficients $C_D1$ to $C_D2$ respectively. These coefficients have respective values 80/128, -23/128, 10/128, -4/128, 1/128 and -1/32, 2/32. Thereafter, the set of samples thus obtained, as indicated in FIG. 4, is summed.

Figure 5A:
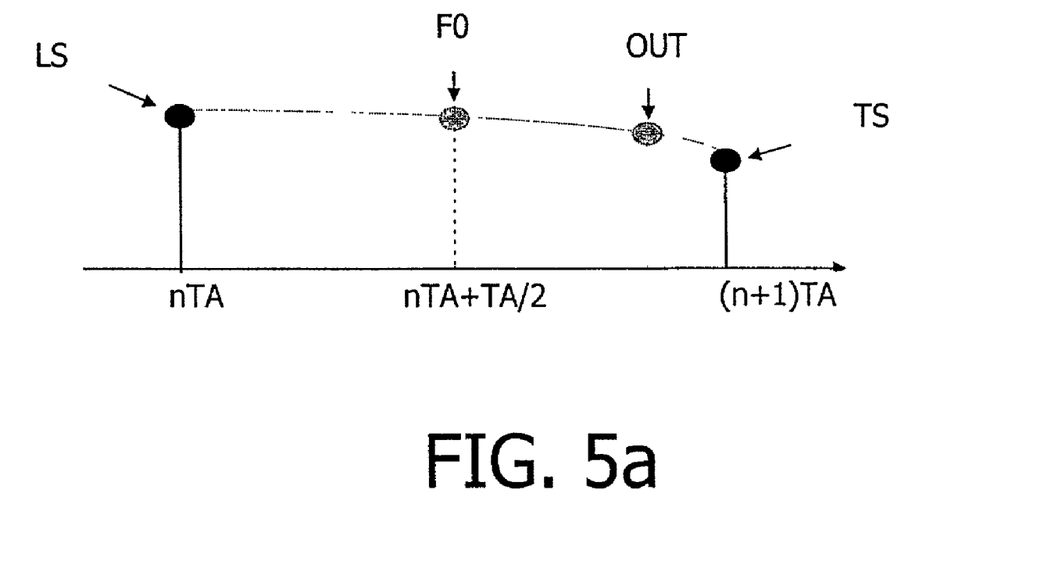
FIG. 5 represents curves relating to parameters of the interpolation means of FIG. 3.
Figure 5B:
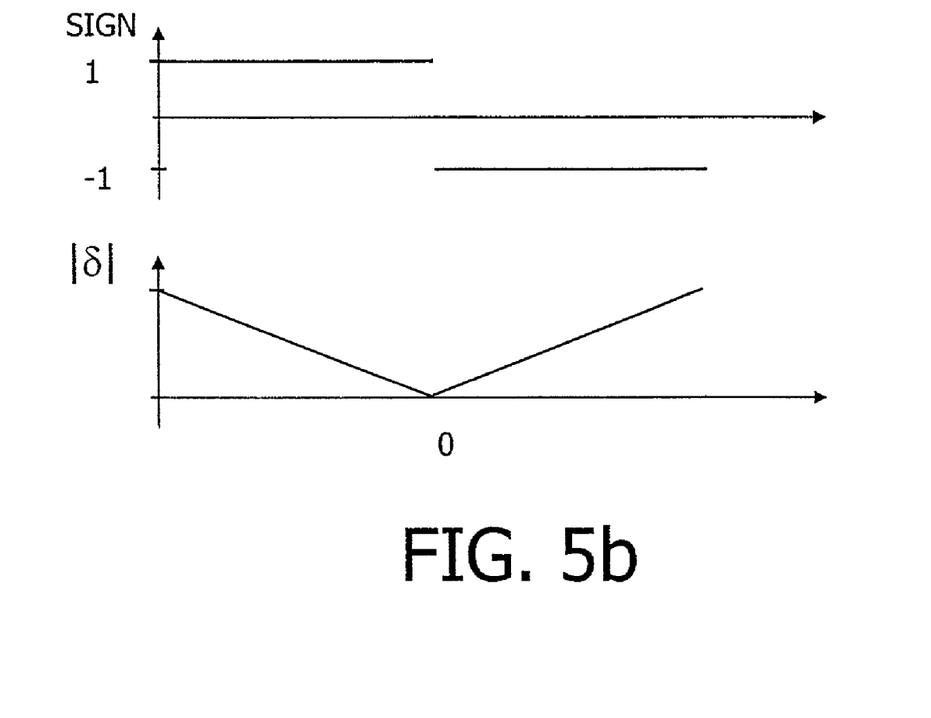

The control means CNTRL provide interpolation parameters associated with each sample to be interpolated, that is to say calculated by interpolation. They thus provide, at each rising edge of the clock Fclk, two interpolation parameters δ and SIGN, and do so, preferably, by virtue of a numerically controlled oscillator NCO. The two parameters are represented in FIG. 5b. The first interpolation parameter δ corresponds to the complementary value of the lag ∂ seen previously, and hence δ=-1, ..., 1. The oscillator NCO comprises a phase parameter μ such that:

|δ|=|2*(μ+0.5)| and

SIGN=-SIGN(μ+0.5)     (2)

Figure 6:
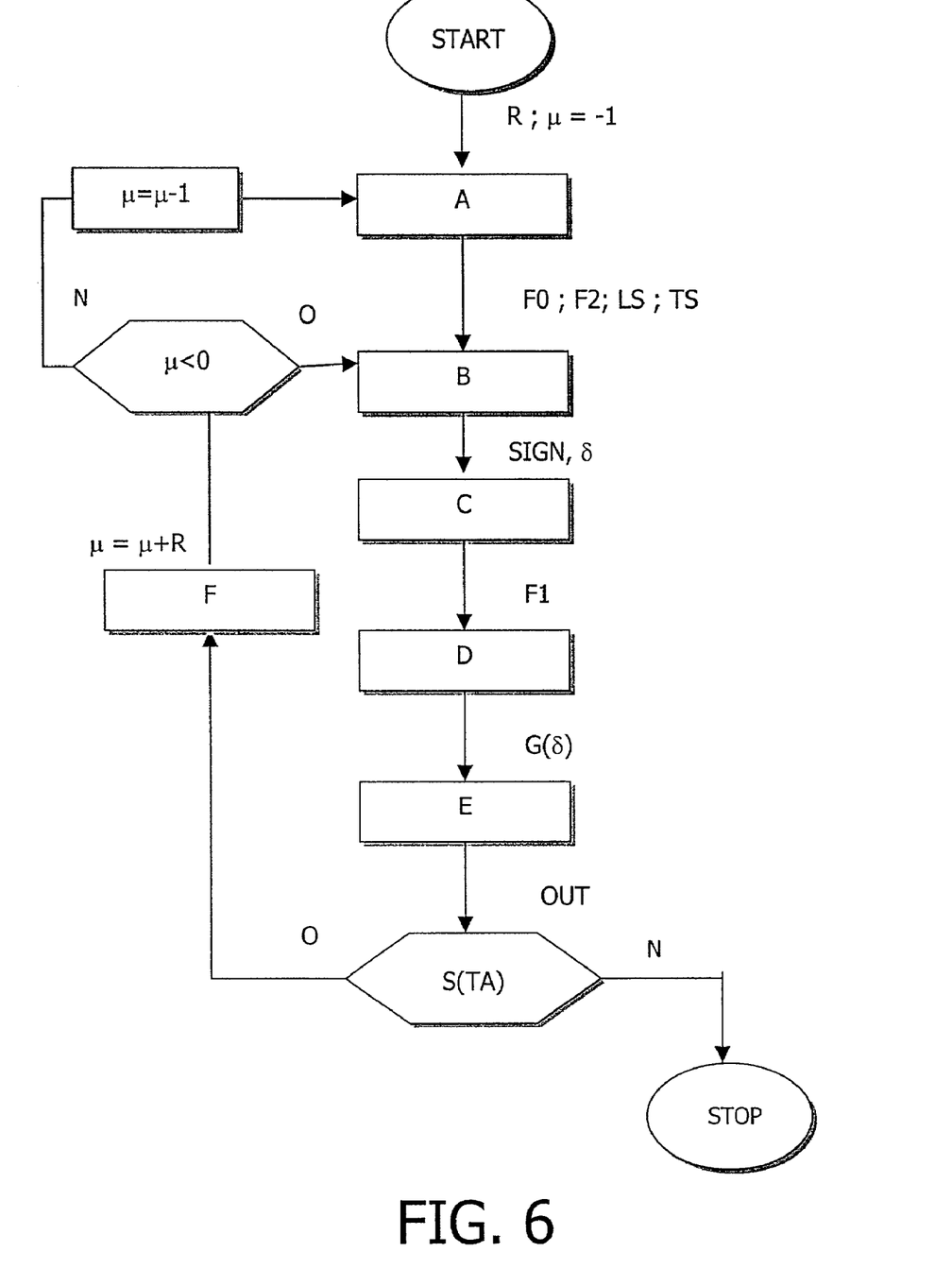
FIG. 6 represents a computational flowchart performed by the interpolation means of FIG. 3, FIG. 7 diagrammatically illustrates a second part of the interpolation means of FIG. 3.

Means for calculating samples MIXER calculate a new sample OUT on the basis of the interpolation parameters δ and SIGN and of signals derived from the digital signal S(TA). The derived signals are the two known base signals LS and TS and the two filtered signals F0 and F2. The interpolation of a sample OUT is undertaken between the two base signals LS and TS and is conducted as follows. The flowchart of FIG. 6 diagrammatically shows the various steps presented below.

During an initialization phase START, the phase parameter μ is initialized preferably to -1 so as to lock onto the first base sample TS.

In a first step A), the first filtered reference signal F0 and the second filtered signal F2. are calculated by virtue of the second filtering means FIRA of FIG. 4 as described previously. The first filtered reference signal F0 is taken as reference signal at δ=0 as shown in FIG. 5a. In FIG. 5a, n is an integer. The base signals LS, TS are also recovered.

In a second step B), the interpolation parameters δ and SIGN are calculated according to (2).

In a third step C), F1 is calculated such that:

$$F1=(\text{closest sample }-F0) \quad (3)$$

The closest sample is one of the base samples which is closest to the sample to be calculated OUT, i.e., when δ>0, $F1=LS-F0$, when δ<0, $F1=TS-F0$.

Figure 7:
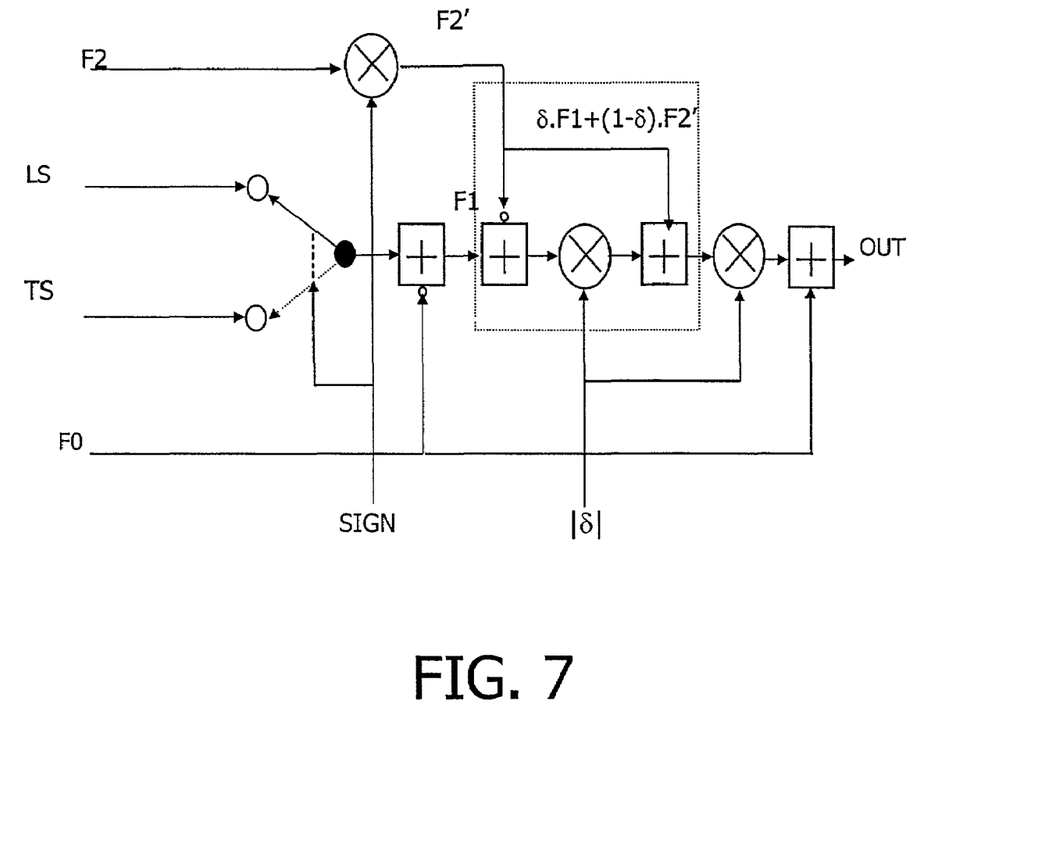

In a fourth step D), the function $G(\delta)=|\delta|*(|\delta|*F1+(1-|\delta|)*SIGN*F2)$ which we saw previously is calculated. FIG. 7 depicts a non-limitative embodiment of the means for calculating samples MIXER making it possible to obtain said function $G(\delta)$.

In a fifth step E), the new sample OUT is calculated, such that:

$$OUT=F0+G(\delta).$$

In a sixth step F), the phase parameter $\mu$ is incremented by a ratio R. Said ratio R is equal to the frequency of the input samples FA over the clock frequency Fclk, i.e.:

$$R=FA/Fclk \text{ or } R=2Fsy/Fclk.$$

While the phase parameter $\mu$ is negative, the preceding steps are recommenced, starting from step B), for a new sample OUT.

As soon as the phase parameter $\mu$ becomes positive, said parameter is decremented by 1 and the preceding steps are recommenced from step A) for a new sample OUT. The decrementation makes it possible to lock on in respect of the interpolation to the known base samples TS and LS, since the samples have been shifted, by one period TA in the delay line.

We stop when there are no more samples S(TA), that is to say when there are no more signals to be transmitted. Consequently, an output signal y(Tclk) oversampled at the clock frequency Fclk is obtained and we have interpolation parameters δ, SIGN which are calculated as a function of the variable and real ratio R proportional to the symbol frequency Fsy over the clock frequency Fclk, the phase parameter $\mu$ making it possible to calculate said interpolation parameters δ, SIGN as a function of said ratio R.

As many samples as desired are calculated between the two base samples TS and LS. It is sufficient to tailor the interpolation between the two base samples LS and TS in particular as a function of the desired ratio R. For example, if R=10, we calculate 10 samples OUT(1,0) OUT(1,1), OUT(1,2), OUT(1,3), OUT(1,4), OUT(1,5), OUT (1,6), OUT(1,7), OUT(1,8) and OUT(1,9) between two base samples TS and LS originating from input samples, S(1) and S(2). In a second example, if R=2, we calculate 2 samples OUT(3,0) and OUT(3,5) between two base samples TS and LS originating from input samples, S(3) and S(4).

Thus, by virtue of the system described, whatever the frequency of the input samples FA, that is to say whatever symbol frequency Fsy is used during a transmission, it is easy to program the numerically controlled oscillator NCO with the new value of the ratio R so as to take this new symbol frequency Fsy into account. In this case, the steps are recommenced from the initialization step START.

Said ratio R can take any real value. This effectively allows flexible management of said symbol frequencies.

Finally, in a third step 3), at the output of the interpolation means INT the modulation means MOD make it possible to modulate the signal thus oversampled on the carrier frequency Fca. Subsequently, said signal is transmitted to the channel CHA.

It will be noted that, according to an alternative embodiment, the sampled signal can be shifted in time by initializing, by means of the numerically controlled oscillator NCO, the phase parameter $\mu$ to a value greater than or less than −1. This will have the advantage of tailoring a transmission of the digital signal DS to be transmitted on the channel with respect to a time window which is associated with said modulator. This is beneficial when there are several transmitting sources. Moreover, it allows a fine tuning of said time window.

However, a last problem still remains. Specifically, all the means of the digital modulator DM must be mutually synchronized in particular on account of the various frequencies used at the level of each of said means. Thus, it is necessary to synchronize the samples received by the modulation means MOD with the calculation of interpolated samples, said calculation of samples with the sending of the samples of the digital input signal S(TA) by the first filtering means FIR and so on and so forth up to the start of the chain of said modulator DM. This synchronization process is commonly called the "handshake procedure". Also, of course, the digital modulator DM preferably comprises appropriate signal synchronization means (not represented) for performing said synchronization. For example, these means are queues which store the signals while waiting for the following means to read them, or else these means are control signals which advise that a signal is available or that a signal is read. Thus, each of the means sends a new output signal as soon as the current output signal is used by the following means and as soon as an input signal is available from the preceding means.

Thus, by virtue of the interpolation, the invention described has the advantage of no longer making the symbol frequency Fsy depend on the clock frequency Fclk.

The invention has another advantage, namely that of being able to choose its symbol frequency Fsy freely, regardless of the clock frequency Fclk used. This makes it possible to optimize the use of the bandwidth of the channel in particular when there are several transmitting sources. Specifically, if we have a channel for which we use a carrier frequency between 5.5 MHz and 8.5 MHz and symbol frequencies of around 1 MHz, and if there are four sources which share this channel, then each one uses the channel in the respective intervals of [5 MHz, 6 MHz], [6 MHz, 7 MHz], [7 MHz, 8 MHz], and [8 MHz, 9 MHz]. When there is noise on a part of the channel, between 7.9 MHz and 8.4 MHz, it is possible, by virtue of the invention, to choose two other symbol frequencies of 0.6 MHz and 0.9 MHz to within the rolloff factor, in such a way that the channel is used in the intervals [5 MHz, 6 MHz], [6 MHz, 7 MHz], [7 MHz, 7.9 MHz], and finally [8,4 MHz, 9 MHz]. Previously, the sources would have been apportioned over the channel in the following manner: [5 MHz, 6 MHz], [6 MHz, 7 MHz] solely for two sources. A part of the channel between 7 MHz and 8.4 MHz would have been unused, although usable. It will also be noted that the device according to the present invention has the advantage of not being expensive and less complex by comparison with a device which included several oscillators making it possible to manage various symbol frequencies.

We shall now explain in what respect the function $G(\partial)$ corresponds to a transfer function $H(Z) = Z^{-\partial/2}$ expressing said delay $\Delta T$. We have $Z=e^{j\theta}$ with $\theta=\omega*TA$ a radial frequency.

We obtain $H(e^{j\theta})=e^{-j\theta/2}$ with an amplitude of 1 and a phase of $\phi=-\partial\theta/2$.

In complex terms, we have $H(\theta)=\cos(\partial\theta/2)-j.\sin(-\partial\theta/2)$. At $\partial=0$, we take a current sample as a reference. In order to calculate a desired sample $H(Z)$, we use filtering means FIRA which by creating a delay of half a period TA/2 make it possible to obtain a first filtered signal F0, and we calculate what has to be added ($G(Z)$) to a closest sample (1). We obtain a differentiation function $G(Z)$ or correction term such that $G(Z)=H(Z)-1$.

i.e. $G(e^{j\theta})=H(e^{j\theta})-1=e^{-j\partial\theta/2}-1=e^{-j\partial\theta/4}.(e^{-j\partial\theta/4}-e^{+j\partial\theta/4})=-e^{-j\partial\theta/4}.2j.\sin(\partial.\theta/4).$  (4)

This is equivalent to $G(e^{j\theta})=-j.2\sin(\partial.\theta/4).e^{-j\partial\theta/4}$ In complex terms, we obtain $G(\theta)=\cos(\partial.\theta/2)-1-j.\sin(\partial.\theta/2)$.

Equation (5) is rewritten as follows.

$G(\partial.\theta)=\partial[(\theta/2).(\sin(\partial.\theta/4)/(\partial.\theta/4)).-j.e^{-j\partial\theta 4}].$  (5)

For $\partial \cong 1$, the term between square brackets can be written as $F1=j. 2 \sin(\theta/4).e^{-j\theta/4}$ and for $\partial \cong 0$, with $(\sin(\partial.\theta/4)/(\partial.\theta/4))\cong 1$, the term between square brackets can be written as $F2.=-j. \theta/2$.

Thus, the function $G(\theta,\partial)$ can be written as $G(\theta,\partial)=\partial.[k1(\partial).F1+k2(\partial).F2]+Fe$, where k1 and k2 are appropriate factors and Fe is an approximation term. We define the first filtered signal F0 for $\partial=1$ such that $F0=e^{-j\theta/2}$. Thus, $F1=F0 -1$ according to relation (4). We make an approximation such that $Fe=0$ and k1 and k2 are linear functions of $\partial$.

We take $k1=\partial$ and $k2=1-\partial$ and we obtain $G(\partial)=\partial[\partial.F1+(1-\partial).F2]$  (6).

Up to now, we have taken the current sample as reference at $\partial=0$. In this case, when $\partial$ changes sign, in order to calculate desired samples it is necessary to add an additional delay and we must recalculate the first filtered signal F0 and subsequently F1. Relation 6 is, therefore, valid only over a restricted domain of $\partial$, i.e. 0, . . . , 1 or −1, . . . ,0. For this reason, it is simpler to take the first filtered signal F0 as the reference sample for calculating the desired samples. In this case, when $\partial$ changes sign, it is the unfiltered samples rather than the filtered samples which have to be shifted by a period TA. Thus, there is no need to add an additional delay since the unfiltered base samples LS and TS can be deduced directly from the delay line from which the filtered reference signal F0 emanates. Only the lag $\partial$ must be modified by taking its complementary value $\delta$ which corresponds to the first interpolation parameter seen earlier. FIGS. 5a and 5b show the relations between the base samples LS and TS, the reference sample F0 and a desired sample OUT.

One consequence is that the signal F1 must be calculated such that F1=closest sample−F0 rather than F1=F0−closest sample, since the reference signal has been shifted by half a period TA/2.

We, therefore, obtain the differentiation function $G(\delta)=|\delta|(|\delta|.F1+(1-|\delta|).\text{SIGN}.F2)$.

Of course, the scope of the invention is in no way limited to the embodiment described and extends to other embodiments in which, for example, the second filtering means FIRA of the interpolation means INT have a structure with three multiplier coefficients $C_L1$, $C_L2$ and $C_L3$ for the filtered reference signal F0 of respective values 39/64, −9/64 and 2/64.

It will be noted that such a digital modulator can be used in particular in an interactive set top box or in a cable modem.

Of course, the invention is in no way limited to the field of cable television, it can be extended to other fields, in particular to all those which use a digital modulator, such as the satellite field or the field of terrestrial transmission.

The invention claimed is:

1. A digital modulator that processes a digital signal in which the modulator's clock frequency is independent of a plurality of symbol frequencies, the modulator comprising:
    interpolation means that interpolates an output sample from the digital signal and in relation to a plurality of interpolation parameters, at least two base signals, a filtered reference signal, and a filtered signal;
    wherein the at least two base signals, the filtered reference signal and the filtered signal are derived from the sampled digital signal, and
    wherein the plurality of interpolation parameters are proportional to a ratio of a symbol frequency, within the plurality of symbol frequencies, and the clock frequency.

2. The digital modulator in claim 1, wherein the interpolation means comprises filtering means that derives, from the digital signal, the at least two base signals, the filtered reference signal and the filtered signal, and further comprising control means that generate the interpolation parameters.

3. The digital modulator in claim 1, further comprising an oscillator that initializes a phase parameter, from which the interpolation parameters are calculated.

4. A set top box comprising a digital modulator as claimed in claims 1 to 3.

5. A cable modem comprising a digital modulator as claimed in claims 1 to 3.

6. A method of processing a digital signal in which a clock frequency is independent of a plurality of symbol frequencies, the method comprising:
    calculating a plurality of interpolation parameters that are defined as functions proportional to a ratio of a symbol frequency, within the plurality of symbol frequencies, and the clock frequency; and
    generating an output sample from the plurality of interpolation parameters, at least two base signals, a filtered reference signal, and a filtered signal.

7. The method of claim 6 further comprising the step of initializing a phase parameter to calculate said interpolation parameters as a function of said ratio of a symbol frequency, within the plurality of symbol frequencies, and the clock frequency.

* * * * *